US011257535B2

(12) United States Patent
Shore et al.

(10) Patent No.: US 11,257,535 B2
(45) Date of Patent: Feb. 22, 2022

(54) APPARATUSES AND METHODS FOR MANAGING ROW ACCESS COUNTS

(71) Applicant: MICRON TECHNOLOGY, INC., Boise, ID (US)

(72) Inventors: Michael A. Shore, Boise, ID (US); Jiyun Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/936,297

(22) Filed: Jul. 22, 2020

(65) Prior Publication Data

US 2020/0349995 A1 Nov. 5, 2020

Related U.S. Application Data

(63) Continuation of application No. 16/268,818, filed on Feb. 6, 2019, now Pat. No. 10,770,127.

(51) Int. Cl.

| | |
|---|---|
| ***G11C 11/406*** | (2006.01) |
| ***G11C 11/4076*** | (2006.01) |
| ***G11C 11/407*** | (2006.01) |

(52) U.S. Cl.

CPC .......... *G11C 11/406* (2013.01); *G11C 11/407* (2013.01); *G11C 11/4076* (2013.01)

(58) Field of Classification Search

CPC . G11C 11/406; G11C 11/407; G11C 11/4076; G11C 11/24

(Continued)

(56) References Cited

U.S. PATENT DOCUMENTS

| | | | |
|---|---|---|---|
| 3,633,175 | A | 1/1972 | Harper |
| 5,291,198 | A | 3/1994 | Dingwall et al. |

(Continued)

FOREIGN PATENT DOCUMENTS

| | | | |
|---|---|---|---|
| CN | 1195173 | A | 10/1998 |
| CN | 101038785 | A | 9/2007 |

(Continued)

OTHER PUBLICATIONS

[Published as 2020-0194050-A1] U.S. Appl. No. 16/797,658, titles "Apparatuses and Methods for Controlling Refresh Operations", filed Feb. 21, 2020.

(Continued)

*Primary Examiner* — Michael T Tran
(74) *Attorney, Agent, or Firm* — Dorsey & Whitney LLP

(57) ABSTRACT

Embodiments of the disclosure are drawn to apparatuses and methods for managing access counts of wordlines of a memory. Repeated access to an aggressor wordline may cause increased data degradation in nearby victim wordlines of the memory. The access count of a given wordline may be stored in counter memory cells positioned along that word-line. When the wordline is accessed, the counter memory cells may be read out to refresh circuit, which may determine the access count based on the values stored in the counter memory cells. If the access count is below a threshold, the access count may be incremented and written back to the counter memory cells. If the access count is above the threshold, the refresh circuit may signal that the accessed wordline is an aggressor, and may reset the value of the access count before writing it back to the counter memory cells.

18 Claims, 6 Drawing Sheets

(58) Field of Classification Search
USPC .................................................. 365/149, 222
See application file for complete search history.

(56) References Cited

U.S. PATENT DOCUMENTS 5,299,159 A 3/1994 Balistreri et al.
5,422,850 A 6/1995 Sukegawa et al.
5,638,317 A 6/1997 Tran
5,699,297 A 12/1997 Yamazaki et al.
5,768,196 A 6/1998 Bloker et al.
5,933,377 A 8/1999 Hidaka
5,943,283 A 8/1999 Wong et al.
5,970,507 A 10/1999 Kato et al.
5,999,471 A 12/1999 Choi
6,002,629 A 12/1999 Kim et al.
6,011,734 A 1/2000 Pappert
6,061,290 A 5/2000 Shirley
6,212,118 B1 4/2001 Fujita
6,310,806 B1 10/2001 Higashi et al.
6,317,381 B1 11/2001 Gans et al.
6,373,738 B1 4/2002 Towler et al.
6,392,952 B1 5/2002 Chen et al.
6,424,582 B1 7/2002 Ooishi
6,434,064 B2 8/2002 Nagai
6,452,868 B1 9/2002 Fister
6,480,931 B1 11/2002 Buti et al.
6,515,928 B2 2/2003 Sato et al.
6,567,340 B1 5/2003 Nataraj et al.
6,950,364 B2 9/2005 Kim
7,027,343 B2 4/2006 Sinha et al.
7,057,960 B1 6/2006 Fiscus et al.
7,082,070 B2 7/2006 Hong
7,187,607 B2 3/2007 Koshikawa et al.
7,203,113 B2 4/2007 Takahashi et al.
7,203,115 B2 4/2007 Eto et al.
7,209,402 B2 4/2007 Shinozaki et al.
7,215,588 B2 5/2007 Lee
7,319,602 B1 1/2008 Srinivasan et al.
7,444,577 B2 10/2008 Best et al.
7,551,502 B2 6/2009 Dono et al.
7,565,479 B2 7/2009 Best et al.
7,830,742 B2 11/2010 Han
8,174,921 B2 5/2012 Kim et al.
8,400,805 B2 3/2013 Yoko
8,451,677 B2 5/2013 Okahiro et al.
8,625,360 B2 1/2014 Iwamoto et al.
8,681,578 B2 3/2014 Narui
8,756,368 B2 6/2014 Best et al.
8,811,100 B2 8/2014 Ku
8,862,973 B2 10/2014 Zimmerman et al.
8,938,573 B2 1/2015 Greenfield et al.
9,032,141 B2 5/2015 Bains et al.
9,047,978 B2 6/2015 Bell et al.
9,058,900 B2 6/2015 Kang
9,087,602 B2 7/2015 Youn et al.
9,117,544 B2 8/2015 Bains et al.
9,123,447 B2 9/2015 Lee et al.
9,153,294 B2 10/2015 Kang
9,190,137 B2 11/2015 Kim et al.
9,190,139 B2 11/2015 Jung et al.
9,251,885 B2 2/2016 Greenfield et al.
9,286,964 B2 3/2016 Halbert et al.
9,299,457 B2 3/2016 Chun et al.
9,311,985 B2 4/2016 Lee et al.
9,324,398 B2 4/2016 Jones et al.
9,384,821 B2 7/2016 Bains et al.
9,390,782 B2 7/2016 Best et al.
9,412,432 B2 8/2016 Narui et al.
9,424,907 B2 8/2016 Fujishiro
9,484,079 B2 11/2016 Lee
9,514,850 B2 12/2016 Kim
9,570,143 B2 2/2017 Lim et al.
9,646,672 B1 5/2017 Kim et al.
9,672,889 B2 6/2017 Lee et al.
9,685,240 B1 * 6/2017 Park .................... G11C 11/4085
9,691,466 B1 6/2017 Kim
9,697,913 B1 7/2017 Mariani et al.
9,734,887 B1 8/2017 Tavva
9,741,409 B2 8/2017 Jones et al.
9,741,447 B2 8/2017 Akamatsu
9,747,971 B2 8/2017 Bains et al.
9,761,297 B1 9/2017 Tomishima
9,786,351 B2 10/2017 Lee et al.
9,799,391 B1 10/2017 Wei
9,805,782 B1 10/2017 Liou
9,805,783 B2 10/2017 Ito et al.
9,818,469 B1 11/2017 Kim et al.
9,865,326 B2 1/2018 Bains et al.
9,865,328 B1 1/2018 Desimone et al.
9,922,694 B2 3/2018 Akamatsu
9,934,143 B2 4/2018 Bains et al.
9,953,696 B2 4/2018 Kim
10,032,501 B2 7/2018 Ito et al.
10,083,737 B2 9/2018 Bains et al.
10,090,038 B2 10/2018 Shin
10,134,461 B2 11/2018 Bell et al.
10,147,472 B2 12/2018 Jones et al.
10,153,031 B2 12/2018 Akamatsu
10,170,174 B1 1/2019 Ito et al.
10,176,860 B1 1/2019 Mylavarapu
10,210,925 B2 2/2019 Bains et al.
10,297,305 B1 5/2019 Moon et al.
10,339,994 B2 7/2019 Ito et al.
10,381,327 B2 8/2019 Ramachandra et al.
10,387,276 B2 8/2019 Ryu et al.
10,446,216 B2 10/2019 Oh et al.
10,490,251 B2 11/2019 Wolff
10,600,462 B2 3/2020 Augustine et al.
10,600,491 B2 3/2020 Chou et al.
10,607,686 B2 3/2020 Akamatsu
10,629,286 B2 * 4/2020 Lee .......................... G11C 8/10
10,679,710 B2 6/2020 Hirashima et al.
10,705,900 B2 * 7/2020 Jin ........................ G06F 11/073
10,770,127 B2 9/2020 Shore et al.
10,811,066 B2 10/2020 Jones et al.
10,832,792 B1 11/2020 Penney et al.
10,861,519 B2 12/2020 Jones et al.
10,867,660 B2 12/2020 Akamatsu
10,930,335 B2 2/2021 Bell et al.
11,043,254 B2 6/2021 Enomoto et al.
2001/0008498 A1 7/2001 Ooishi
2002/0007476 A1 1/2002 Kishino
2002/0078311 A1 6/2002 Matsuzaki et al.
2002/0080677 A1 6/2002 Watanabe et al.
2002/0181301 A1 12/2002 Takahashi et al.
2003/0063512 A1 4/2003 Takahashi et al.
2003/0067825 A1 4/2003 Shimano et al.
2003/0123301 A1 7/2003 Jang et al.
2003/0193829 A1 10/2003 Morgan et al.
2003/0231540 A1 12/2003 Lazar et al.
2004/0004856 A1 1/2004 Sakimura et al.
2004/0008544 A1 1/2004 Shinozaki et al.
2004/0022093 A1 2/2004 Lee
2004/0052142 A1 3/2004 Ikehashi et al.
2004/0114446 A1 6/2004 Takahashi et al.
2004/0130959 A1 7/2004 Kawaguchi
2004/0174757 A1 9/2004 Garverick et al.
2004/0184323 A1 9/2004 Mori et al.
2004/0218431 A1 11/2004 Chung et al.
2005/0041502 A1 2/2005 Pemer
2005/0105315 A1 5/2005 Shin et al.
2005/0243629 A1 11/2005 Lee
2005/0265104 A1 12/2005 Remaklus et al.
2006/0083099 A1 4/2006 Bae
2006/0087903 A1 4/2006 Riho et al.
2006/0176744 A1 8/2006 Stave
2006/0262616 A1 11/2006 Chen
2007/0008799 A1 1/2007 Dono et al.
2007/0014174 A1 * 1/2007 Ohsawa ................ G11C 11/406
365/222
2007/0028068 A1 2/2007 Golding et al.
2007/0030746 A1 2/2007 Best et al.
2007/0033339 A1 2/2007 Best et al.

(56) References Cited

U.S. PATENT DOCUMENTS

2007/0133330 A1* 6/2007 Ohsawa ................ G11C 11/406
365/222
2007/0230264 A1 10/2007 Eto
2007/0237016 A1 10/2007 Miyamoto et al.
2007/0297252 A1 12/2007 Singh
2008/0028260 A1 1/2008 Oyagi et al.
2008/0031068 A1 2/2008 Yoo et al.
2008/0062742 A1 3/2008 Wang
2008/0126893 A1 5/2008 Harrand
2008/0130394 A1 6/2008 Dono et al.
2008/0181048 A1 7/2008 Han
2008/0224742 A1 9/2008 Pomichter
2008/0253212 A1* 10/2008 Iida ...................... G11C 11/406
365/222
2008/0266990 A1 10/2008 Loeffler
2008/0288720 A1 11/2008 Atwal et al.
2008/0301362 A1 12/2008 Cavanna et al.
2008/0316845 A1 12/2008 Wang et al.
2009/0021999 A1 1/2009 Tanimura et al.
2009/0059641 A1 3/2009 Jeddeloh
2009/0077571 A1 3/2009 Gara et al.
2009/0161457 A1 6/2009 Wakimoto
2009/0168571 A1 7/2009 Pyo et al.
2009/0185440 A1 7/2009 Lee
2009/0201752 A1 8/2009 Riho et al.
2009/0213675 A1 8/2009 Shino
2009/0251971 A1* 10/2009 Futats ................. G11C 16/344
365/185.22
2009/0296510 A1* 12/2009 Lee ...................... G11C 11/406
365/222
2010/0005217 A1 1/2010 Jeddeloh
2010/0005376 A1 1/2010 Laberge et al.
2010/0054011 A1 3/2010 Kim
2010/0074042 A1 3/2010 Fukuda
2010/0080074 A1 4/2010 Ohmaru et al.
2010/0110809 A1 5/2010 Kobayashi et al.
2010/0110810 A1 5/2010 Kobayashi
2010/0131812 A1 5/2010 Mohammad
2010/0157693 A1 6/2010 Iwai et al.
2010/0182863 A1 7/2010 Fukiage
2010/0329069 A1 12/2010 Ito et al.
2011/0026290 A1 2/2011 Noda et al.
2011/0051530 A1 3/2011 Kushida
2011/0055495 A1 3/2011 Remaklus, Jr. et al.
2011/0069572 A1 3/2011 Lee et al.
2011/0122987 A1 5/2011 Neyer
2011/0216614 A1 9/2011 Hosoe
2011/0225355 A1 9/2011 Kajigaya
2011/0286271 A1 11/2011 Chen
2011/0310648 A1 12/2011 Iwamoto et al.
2011/0317462 A1 12/2011 Gyllenhammer et al.
2012/0014199 A1 1/2012 Narui
2012/0059984 A1 3/2012 Kang et al.
2012/0151131 A1 6/2012 Kilmer et al.
2012/0213021 A1 8/2012 Riho et al.
2012/0254472 A1 10/2012 Ware et al.
2013/0003467 A1 1/2013 Klein
2013/0003477 A1 1/2013 Park et al.
2013/0057173 A1 3/2013 Yao et al.
2013/0107623 A1 5/2013 Kavalipurapu et al.
2013/0173971 A1 7/2013 Zimmerman
2013/0254475 A1 9/2013 Perego et al.
2013/0304982 A1 11/2013 Jung et al.
2014/0006703 A1 1/2014 Bains et al.
2014/0006704 A1 1/2014 Greenfield et al.
2014/0013169 A1 1/2014 Kobla et al.
2014/0013185 A1 1/2014 Kobla et al.
2014/0050004 A1 2/2014 Mochida
2014/0078841 A1 3/2014 Chopra
2014/0078842 A1 3/2014 Oh et al.
2014/0078845 A1 3/2014 Song
2014/0089576 A1 3/2014 Bains et al.
2014/0095780 A1 4/2014 Bains et al.
2014/0095786 A1 4/2014 Moon et al.
2014/0119091 A1 5/2014 You et al.
2014/0136763 A1 5/2014 Li et al.
2014/0143473 A1 5/2014 Kim et al.
2014/0177370 A1 6/2014 Halbert et al.
2014/0189228 A1 7/2014 Greenfield et al.
2014/0219043 A1 8/2014 Jones et al.
2014/0237307 A1 8/2014 Kobla et al.
2014/0241099 A1 8/2014 Seo et al.
2014/0254298 A1 9/2014 Dally
2014/0269021 A1 9/2014 Yang et al.
2014/0281206 A1 9/2014 Crawford et al.
2014/0281207 A1 9/2014 Mandava et al.
2014/0293725 A1 10/2014 Best et al.
2014/0355332 A1 12/2014 Youn et al.
2015/0049567 A1 2/2015 Chi
2015/0055420 A1 2/2015 Bell et al.
2015/0078112 A1 3/2015 Huang
2015/0089326 A1 3/2015 Joo et al.
2015/0162067 A1 6/2015 Kim et al.
2015/0170728 A1 6/2015 Jung
2015/0199126 A1 7/2015 Jayasena et al.
2015/0206572 A1 7/2015 Lim et al.
2015/0213872 A1 7/2015 Mazumder et al.
2015/0213877 A1 7/2015 Darel
2015/0228341 A1 8/2015 Watanabe et al.
2015/0243339 A1 8/2015 Bell et al.
2015/0255140 A1 9/2015 Song
2015/0262652 A1 9/2015 Igarashi
2015/0279441 A1 10/2015 Greenberg et al.
2015/0279442 A1 10/2015 Hwang
2015/0294711 A1 10/2015 Gaither et al.
2015/0340077 A1 11/2015 Akamatsu
2015/0356048 A1 12/2015 King
2016/0019940 A1 1/2016 Jang et al.
2016/0027498 A1 1/2016 Ware et al.
2016/0027531 A1 1/2016 Jones et al.
2016/0027532 A1 1/2016 Kim
2016/0042782 A1 2/2016 Narui et al.
2016/0078845 A1 3/2016 Lin et al.
2016/0078911 A1 3/2016 Fujiwara et al.
2016/0078918 A1 3/2016 Hyun et al.
2016/0086649 A1 3/2016 Hong et al.
2016/0086651 A1 3/2016 Kim
2016/0093402 A1 3/2016 Kitagawa et al.
2016/0099043 A1 4/2016 Tu
2016/0125931 A1 5/2016 Doo et al.
2016/0133314 A1 5/2016 Hwang et al.
2016/0140243 A1 5/2016 Adams et al.
2016/0163372 A1 6/2016 Lee et al.
2016/0172056 A1 6/2016 Huh
2016/0180917 A1 6/2016 Chishti et al.
2016/0180921 A1 6/2016 Jeong
2016/0196863 A1 7/2016 Shin et al.
2016/0202926 A1 7/2016 Benedict
2016/0211008 A1 7/2016 Benedict et al.
2016/0225433 A1 8/2016 Bains et al.
2016/0225461 A1 8/2016 Tuers et al.
2016/0336060 A1 11/2016 Shin
2016/0343423 A1 11/2016 Shido
2017/0011792 A1 1/2017 Oh et al.
2017/0076779 A1 3/2017 Bains et al.
2017/0092350 A1 3/2017 Halbert et al.
2017/0117030 A1 4/2017 Fisch et al.
2017/0133085 A1 5/2017 Kim et al.
2017/0139641 A1* 5/2017 Cha ..................... G11C 11/4076
2017/0140807 A1 5/2017 Sun et al.
2017/0140811 A1* 5/2017 Joo .................. G11C 11/40603
2017/0148504 A1 5/2017 Saifuddin et al.
2017/0177246 A1 6/2017 Miller et al.
2017/0186481 A1 6/2017 Oh et al.
2017/0213586 A1 7/2017 Kang et al.
2017/0221546 A1 8/2017 Loh et al.
2017/0263305 A1 9/2017 Cho
2017/0287547 A1 10/2017 Ito et al.
2017/0323675 A1 11/2017 Jones et al.
2017/0352399 A1 12/2017 Yokoyama et al.
2017/0371742 A1 12/2017 Shim et al.
2017/0372767 A1* 12/2017 Kang ............... G11C 11/40622
2018/0005690 A1 1/2018 Morgan
2018/0025770 A1 1/2018 Ito et al.

(56) References Cited

U.S. PATENT DOCUMENTS

2018/0025772 A1 1/2018 Lee et al.
2018/0060194 A1 3/2018 Ryu et al.
2018/0061483 A1 3/2018 Morgan
2018/0082737 A1 3/2018 Lee
2018/0084314 A1 3/2018 Koyama
2018/0090199 A1 3/2018 Kim et al.
2018/0096719 A1 4/2018 Tomishima et al.
2018/0102776 A1 4/2018 Chandrasekar et al.
2018/0107417 A1 4/2018 Shechter et al.
2018/0114561 A1 4/2018 Fisch et al.
2018/0114565 A1 4/2018 Lee
2018/0158504 A1 6/2018 Akamatsu
2018/0182445 A1 6/2018 Lee et al.
2018/0203621 A1 7/2018 Ahn et al.
2018/0218767 A1 8/2018 Wolff
2018/0261268 A1 9/2018 Hyun et al.
2018/0294028 A1 10/2018 Lee et al.
2018/0308539 A1 10/2018 Ito et al.
2018/0341553 A1 11/2018 Koudele et al.
2019/0013059 A1 1/2019 Akamatsu
2019/0043558 A1 2/2019 Suh et al.
2019/0051344 A1 2/2019 Bell et al.
2019/0066759 A1 2/2019 Nale
2019/0066762 A1* 2/2019 Koya .................. G11C 11/4076
2019/0088315 A1 3/2019 Saenz et al.
2019/0088316 A1 3/2019 Inuzuka et al.
2019/0096492 A1 3/2019 Cai et al.
2019/0103147 A1 4/2019 Jones et al.
2019/0130961 A1 5/2019 Bell et al.
2019/0139599 A1 5/2019 Ito et al.
2019/0147941 A1 5/2019 Qin et al.
2019/0147964 A1 5/2019 Yun et al.
2019/0161341 A1 5/2019 Howe
2019/0172518 A1* 6/2019 Chen .................. G11C 11/4094
2019/0196730 A1 6/2019 Imran
2019/0198078 A1 6/2019 Hoang et al.
2019/0198090 A1 6/2019 Lee
2019/0198099 A1* 6/2019 Mirichigni .......... H01L 27/2409
2019/0205253 A1 7/2019 Roberts
2019/0207736 A1 7/2019 Ben-tovim et al.
2019/0228810 A1 7/2019 Jones et al.
2019/0228813 A1 7/2019 Nale et al.
2019/0228815 A1 7/2019 Morohashi et al.
2019/0243708 A1 8/2019 Cha et al.
2019/0252020 A1 8/2019 Rios et al.
2019/0267077 A1 8/2019 Ito et al.
2019/0279706 A1 9/2019 Kim
2019/0333573 A1* 10/2019 Shin ...................... G11C 11/408
2019/0348100 A1 11/2019 Smith et al.
2019/0348103 A1 11/2019 Jeong et al.
2019/0348107 A1 11/2019 Shin et al.
2019/0349545 A1 11/2019 Koh et al.
2019/0362774 A1 11/2019 Kuramori et al.
2019/0371391 A1* 12/2019 Cha ..................... G06F 11/1016
2019/0385661 A1 12/2019 Koo et al.
2019/0385667 A1 12/2019 Morohashi et al.
2019/0386557 A1 12/2019 Wang et al.
2020/0005857 A1 1/2020 Ito et al.
2020/0075106 A1 3/2020 Tokutomi et al.
2020/0082873 A1 3/2020 Wolff
2020/0090760 A1 3/2020 Purahmad et al.
2020/0135263 A1 4/2020 Brown et al.
2020/0194050 A1 6/2020 Akamatsu
2020/0194056 A1* 6/2020 Sakurai ............. G11C 11/40618
2020/0201380 A1 6/2020 Murali et al.
2020/0202921 A1 6/2020 Morohashi et al.
2020/0211626 A1* 7/2020 Hiscock ............... G11C 7/1006
2020/0211633 A1 7/2020 Okuma
2020/0211636 A1* 7/2020 Hiscock ............ G11C 11/40622
2020/0302994 A1 9/2020 Enomoto et al.
2020/0321049 A1* 10/2020 Meier ............... G11C 11/40615
2020/0365208 A1 11/2020 Schreck et al.
2020/0381040 A1 12/2020 Penney et al.
2020/0395072 A1 12/2020 Penney et al.
2021/0005229 A1* 1/2021 Hiscock ................. G11C 5/148
2021/0005240 A1 1/2021 Brown et al.
2021/0020223 A1 1/2021 Ayyapureddi et al.
2021/0020262 A1 1/2021 Penney et al.
2021/0026732 A1* 1/2021 Park ...................... G06F 11/076
2021/0057012 A1 2/2021 Ayyapureddi et al.
2021/0057013 A1 2/2021 Jenkinson et al.
2021/0057021 A1 2/2021 Wu et al.
2021/0065755 A1* 3/2021 Kim ........................ H03L 7/089
2021/0065764 A1* 3/2021 Cheng ................... G06F 3/0688
2021/0142852 A1 5/2021 Schreck et al.
2021/0158851 A1 5/2021 Ayyapureddi et al.
2021/0158860 A1 5/2021 Wu et al.
2021/0158861 A1* 5/2021 Jeong ................ G11C 11/40611
2021/0201984 A1* 7/2021 Khasawneh ........ G11C 11/4093
2021/0225432 A1 7/2021 Enomoto et al.
2021/0241810 A1* 8/2021 Hollis ................... G11C 11/406
2021/0265504 A1 8/2021 Ishizu et al.

FOREIGN PATENT DOCUMENTS

CN 101067972 A 11/2007
CN 101331554 A 12/2008
CN 101458658 A 6/2009
CN 101622607 A 1/2010
CN 102113058 A 6/2011
CN 102483952 A 5/2012
CN 104350546 A 2/2015
CN 106710621 A 5/2017
CN 107871516 A 4/2018
JP H0773682 A 3/1995
JP 2005-216429 A 8/2005
JP 2011-258259 12/2011
JP 2011-258259 A 12/2011
JP 4911510 B2 1/2012
JP 2013-004158 A 1/2013
KR 1020180064940 A 6/2018
KR 1020180085184 A 7/2018
WO 2014120477 8/2014
WO 2015030991 A1 3/2015
WO 2017171927 A1 10/2017
WO 2019222960 A1 11/2019
WO 2020010010 A1 1/2020
WO 2020191222 A1 9/2020
WO 2021003085 A1 1/2021

OTHER PUBLICATIONS

[Published as 2020-0219555-A1] U.S. Appl. 16/818,981 titled "Apparatuses and Methods for Staggered Timing of Targeted Refresh Operations" filed Mar. 13, 2020.
[Published as 2020-0219556-A1] U.S. Appl. No. 16/824,460, titled "Semiconductor Device Performing Row Hammer Refresh Operation", dated Mar. 19, 2020.
[Published as US-2020-0005857-A1] U.S. Appl. No. 16/025,844, titled "Apparatus and Methods for Triggering Row Hammer Address Sampling", filed Jul. 2, 2018.
[Published as US-2020-0176050-A1] U.S. Appl. No. 16/783,063, titled "Apparatus and Methods for Triggering Row Hammer Address Sampling", dated Feb. 5, 2020.
[Published as US-2020-0202921-A1] U.S. Appl. No. 16/805,197, titled "Apparatuses and Methods for Calculating Row Hammer Refresh Addresses in a Semiconductor Device", dated Feb. 28, 2020.
[Published as US-2020-0211632-A1] U.S. Appl. No. 16/232,837, titled "Apparatuses and Methods for Distributed Targeted Refresh Operations", filed Dec. 26, 2018.
[Published as US-2020-0211634-A1] U.S. Appl. No. 16/818,989, titled "Semiconductor Device Performing Row Hammer Refresh Operation", dated Mar. 13, 2020.
International Search Report and Written Opinion for PCT/US2020/017019 dated Jun. 9, 2020.
U.S. Appl. No. 16/546,152 titled "Apparatuses and Methods for Analog Row Access Tracking" filed Aug. 20, 2019.
U.S. Appl. No. 16/548,027 titled "Apparatuses, Systems, and Methods for Analog Row Access Rate Determination" filed Aug. 22, 2019.

(56) References Cited

OTHER PUBLICATIONS

U.S. Appl. No. 16/549,942 titled "Apparatuses and Methods for Lossy Row Access Counting" filed Aug. 23, 2019.
U.S. Appl. No. 16/788,657, titled "Semiconductor Device Performing Row Hammer Refresh Operation", dated Feb. 12, 2020.
U.S. Appl. No. 15/881,256 entitled 'Apparatuses and Methods for Detecting a Row Hammer Attack With a Bandpass Filter' filed Jan. 26, 2018.
U.S. Appl. No. 16/425,525 titled "Apparatuses and Methods for Tracking All Row Accesses" filed May 29, 2019.
U.S. Appl. No. 16/427,105 titled "Apparatuses and Methods for Priority Targeted Refresh Operations" filed May 30, 2019.
U.S. Appl. No. 16/427,140 titled "Apparatuses and Methods for Tracking Row Access Counts Between Multiple Register Stacks" filed May 30, 2019.
U.S. Appl. No. 16/437,811 titled "Apparatuses, Systems, and Methods for Determining Extremum Numerical Values" filed Jun. 11, 2019.
U.S. Appl. No. 16/513,400 titled "Apparatuses and Methods for Tracking Row Accesses" filed Jul. 16, 2019.
U.S. Appl. No. 16/537,981 titled "Apparatuses and Methods for Controlling Targeted Refresh Rates" filed Aug. 12, 2019.
U.S. Appl. No. 16/655,110 titled "Apparatuses and Methods for Dynamic Targeted Refresh Steals" filed Oct. 16, 2019.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory" filed Oct. 27, 2017; pp. all.
U.S. Appl. No. 16/012,679, titled "Apparatuses and Methods for Multiple Row Hammer Refresh Address Sequences", filed Jun. 19, 2018.
U.S. Appl. No. 16/020,863, titled "Semiconductor Device", filed Jun. 27, 2018.
U.S. Appl. No. 16/084,119, titled "Apparatuses and Methods for Pure-Time, Self Adopt Sampling for Row Hammer Refresh Sampling", filed Sep. 11, 2018.
U.S. Appl. No. 16/112,471 titled "Apparatuses and Methods for Controlling Refresh Operations" filed Aug. 24, 2018.
U.S. Appl. No. 16/160,801, titled "Apparatuses and Methods for Selective Row Refreshes" filed Oct. 15, 2018, pp. all.
U.S. Appl. No. 16/176.932, titled "Apparatuses and Methods for Access Based Refresh Timing", filed Oct. 31, 2018.
U.S. Appl. No. 16/208,217, titled "Semiconductor Device Performing Row Hammer Refresh Operation", filed Dec. 3, 2018.
U.S. Appl. No. 16/230,300, titled "Apparatuses and Methods for Staggered Timing of Targeted Refresh Operations" filed Dec. 21, 2018.
U.S. Appl. No. 16/231,327 titled "Apparatuses and Methods for Selective Row Refreshes", filed Dec. 21, 2018.
U.S. Appl. No. 16/237,291, titled "Apparatus and Methods for Refreshing Memory", filed Dec. 31, 2018.
U.S. Appl. No. 16/268,818, titled "Apparatuses and Methods for Managing Row Access Counts", filed Feb. 6, 2019.
U.S. Appl. No. 16/286,187 titled "Apparatuses and Methods for Memory Mat Refresh Sequencing" filed Feb. 26, 2019.
U.S. Appl. No. 16/290,730, titled "Semiconductor Device Performing Row Hammer Refresh Operation", filed Mar. 1, 2019.
U.S. Appl. No. 16/358,587, titled "Semiconductor Device Having Cam That Stores Address Signals", filed Mar. 19, 2019.
U.S. Appl. No. 16/374,623, titled "Semiconductor Device Performing Row Hammer Refresh Operation", filed Apr. 3, 2019.
U.S. Appl. No. 16/375,716 titled "Stagger RHR Pumping Scheme Across Die Banks" filed Apr. 4, 2019; pp. all.
U.S. Appl. No. 16/411,573 titled "Apparatuses, Systems, and Methods for a Content Addressable Memory Cell" filed May 14, 2019.
U.S. Appl. No. 16/411,698 title "Semiconductor Device" filed May 14, 2019.
U.S. Appl. No. 16/427,330 titled "Apparatuses and Methods for Storing Victim Row Data" filed May 30, 2019.
U.S. Appl. No. 16/428,625 titled "Apparatuses and Methods for Tracking Victim Rows" filed May 31, 2019.
U.S. Appl. No. 16/431,641 titled "Apparatuses and Methods for Controlling Steal Rates" filed Jun. 4, 2019.
U.S. Appl. No. 16/549,411 titled "Apparatuses and Methods for Dynamic Refresh Allocation" filed Aug. 23, 2019.
U.S. Appl. No. 16/682,606, titled "Apparatuses and Methods for Distributing Row Hammer Refresh Events Across a Memory Device", filed Nov. 13, 2019.
U.S. Appl. No. 16/886,284, titled "Apparatuses and Methods for Access Based Refresh Timing", filed May 28, 2020.
U.S. Appl. No. 15/876.566 entitled 'Apparatuses and Methods for Calculating Row Hammer Refresh Addresses in a Semiconductor Device' filed Jan. 22, 2018.
U.S. Appl. No. 15/656,084 Titled: Apparatuses and Methods for Targeted Refreshing of Memory filed Jul. 21, 2017.
U.S. Appl. No. 15/715,846, entitled "Semiconductor Device", filed Sep. 26, 2017, pp. all.
U.S. Appl. No. 15/888,993, entitled "Apparatuses and Methods for Controlling Refresh Operations", filed Feb. 5, 2018, pp. all.
U.S. Appl. No. 16/190,627 titled "Apparatuses and Methods for Targeted Refreshing of Memory" filed Nov. 14, 2018, pp. all.
U.S. Appl. No. 16/459,520 titled "Apparatuses and Methods for Monitoring Word Line Accesses", filed Jul. 1, 2019, pp. all.
"U.S. Appl. No. 15/281,818, entitled: "Semiconductor Device" filed Sep. 30, 2016".
Kim, et al., "Flipping Bits in MemoryWithout Accessing Them: An Experimental Study of DRAM Disturbance Errors", IEEE, Jun. 2014, 12 pgs.
U.S. Appl. No. 17/102,266, titled "Apparatuses and Methods for Tracking Word Line Accesses", dated Nov. 23, 2020.
U.S. Appl. No. 17/188,036 titled "Apparatuses and Methods for Analog Row Access Tracking" filed Feb. 4, 2021.
U.S. Appl. No. 17/170,616 titled "Apparatuses, Systems, and Methods for Analog Row Access Rate Determination" filed Feb. 8, 2021.
U.S. Appl. No. 17/007,069 titled "Apparatuses and Methods for Providing Refresh Addresses" filed Aug. 31, 2020.
U.S. Appl. No. 17/443,056 titled "Apparatuses and Methods for Multiple Row Hammer Refresh Address Sequences" filed Jul. 20, 2021.
U.S. Appl. No. 17/153,555 titled "Apparatuses and Methods for Dynamically Allocated Aggressor Detection" filed Jan. 20, 2021.
U.S. Appl. No. 17/201,941 titled "Apparatuses and Methods for Sketch Circuits for Refresh Binning" filed Mar. 15, 2021.
U.S. Appl. No. 17/301,533 titled "Semiconductor Device Having Cam That Stores Address Signals" filed Apr. 6, 2021.
U.S. Appl. No. 17/375,817 titled "Apparatuses and Methods for Monitoring Word Line Accesses" filed Jul. 14, 2021.
U.S. Appl. No. 17/444,925 titled "Apparatuses and Methods for Countering Memory Attacks" filed Aug. 12, 2021.
U.S. Appl. No. 17/446,710 titled "Apparatuses, Systems, and Methods for Determining Extremum Numericalvalues" filed Sep. 1, 2021.
U.S. Appl. No. 17/470,883 titled "Apparatuses and Methods for Tracking Victim Rows" filed Sep. 9, 2021.
U.S. Appl. No. 17/456,849 titled "Apparatuses, Systems, and Methods for Main Sketch and Slim Sketch Circuitfor Row Address Tracking" filed Nov. 29, 2021.
U.S. Appl. No. 17/565,119 titled "Apparatuses and Methods for Row Hammer Counter Mat" filed Dec. 29, 2021.
U.S. Appl. No. 17/565,187 titled "Apparatuses and Methods for Row Hammer Counter Mat" filed Dec. 29, 2021.

* cited by examiner

APPARATUSES AND METHODS FOR MANAGING ROW ACCESS COUNTS

CROSS-REFERENCE TO RELATED APPLICATION(S)

This application is a continuation of pending U.S. patent application Ser. No. 16/268,818 filed Feb. 6, 2019. The aforementioned application is incorporated herein by reference, in its entirety, for any purpose.

BACKGROUND

Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. Repeated access to a particular memory cell or group of memory cells (often referred to as a 'row hammer') may cause an increased rate of data degradation in nearby memory cells. It may be desirable to identify addresses which are repeatedly accessed so that the nearby memory cells may be refreshed.

DETAILED DESCRIPTION

Figure 1:
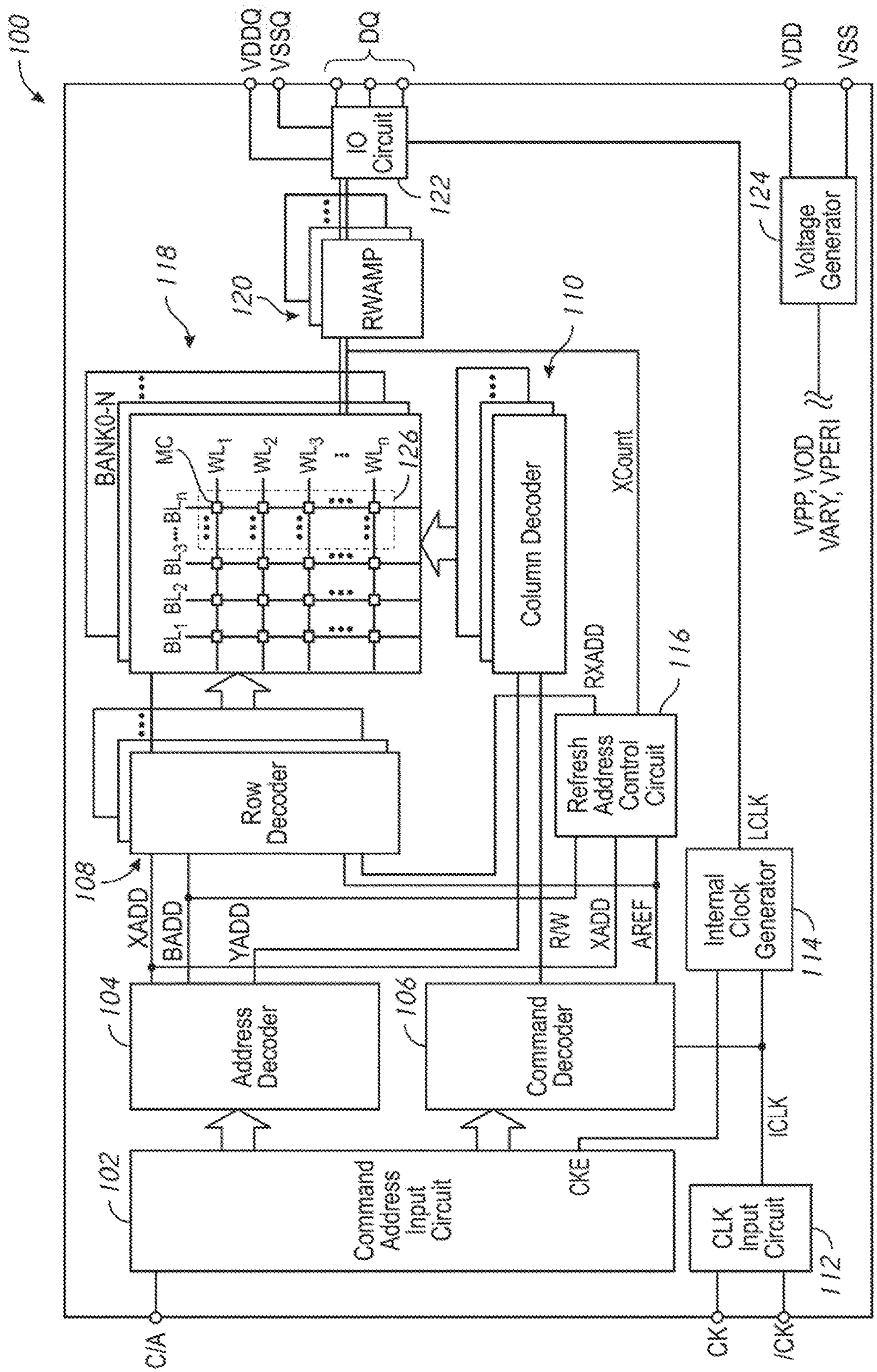
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (word lines) and columns (bit lines), and the memory cells may be accessed on a row-by-row basis. The memory cells may also be periodically refreshed on a row-by-row basis as part of an auto-refresh operation, where the information along the row is restored to prevent data loss due to the decay over time (e.g., the memory cells may be restored to an initial charge value associated with the logical level stored in that memory cell). Repeated access to a particular row of memory (e.g., an aggressor row) may cause an increased rate of decay in neighboring rows (e.g., victim rows) due, for example, to electromagnetic coupling between the rows. The victim rows may decay faster than the timing of the auto-refresh operation. In order to prevent information from being lost, it may be desirable to identify aggressor rows so that the corresponding victim rows can be refreshed as part of a targeted refresh operation.

Aggressor rows may be determined based on one or more of a number of accesses to the row, the rate of accesses to the row, and/or the length of time over which the row is accessed. In order to prevent row hammer effects from being missed, it may be desirable to track accesses to each row of a memory device.

The present disclosure is drawn to apparatuses, systems, and methods for managing row access counts. Each row of the memory may include a number of memory cells which hold an access count of the row they are located on. These memory cells may generally be referred to as counter memory cells. In some embodiments of the disclosure, the counter memory cells are additional memory cells to the memory cells in the row of memory. In some embodiments of the disclosure, the counter memory cells are included in the memory cells of the row of memory. The individual counter memory cells for a given row may store bits that, when taken together, represent an access count for that row. When the row is accessed, the counter memory cells may be read to a counter circuit. The counter circuit may check a value of the count. If the value of the count is below (or equal to) a threshold, the value of the count may be changed (e.g., incremented), and the changed value may be written back to the counter memory cells of the accessed row. If the value of the count is above the threshold value, a control signal may be provided which indicates that the currently accessed row is an aggressor row. The value of the count may then be reset, and the reset value written back to the counter memory cells. Based on the control signal, the memory device may determine the positions of one or more victim rows associated with the aggressor row (e.g., the currently accessed row), and perform a targeted refresh on the victim rows (and/or queue up the aggressor row for a later targeted refresh operation). By storing an access count on the row with which the access count is associated, it may be possible to achieve increased reliability and/or speed of access tracking.

FIG. 1 is a block diagram of a semiconductor device according to at least one embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL (rows), a plurality of bit lines BL (columns), and a plurality of memory cells MC arranged at intersections of the plurality of word lines WL and the plurality of bit lines BL. Some of the memory cells MC along the wordlines may be counter memory cells 126. The counter memory cells 126 may be positioned at the intersection of counter bitlines and the wordlines. There may be multiple counter memory cells 126 along a given wordline, and collectively the values stored in the counter memory cells 126 may represent a respective access count XCount of the wordline. A data bus associated with the counter memory cells 126 may be coupled to the refresh address control circuit 116. The data bus associated with the counter memory cells 126 may be separate from the data bus which couples the other memory cells to the IO circuit 122.

The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL. Information may generally be read from and written to the counter memory cells 126 in an analogous fashion, except that the data in the counter memory cells 126 are read and written by the refresh address control circuit 116.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, TSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a row activation command ACT. When the row activation command ACT is received, a bank address BADD and a row address XADD are timely supplied with the row activation command ACT.

The device 100 may receive an access command which is a read command. When a read command is received, a bank address BADD and a column address YADD are timely supplied with the read command, read data is read from memory cells in the memory array 118 corresponding to the row address XADD and column address YADD. The read command is received by the command decoder 106, which provides internal commands so that read data from the memory array 118 is provided to the read/write amplifiers 120. The read data is output to outside from the data terminals DQ via the input/output circuit 122. The access count Xcount stored in the counter memory cells 126 of the row associated with the row address XADD are read to the refresh address control circuit 116, and an updated value of the access count Xcount' is written back to the counter memory cells 126 of the row XADD.

The device 100 may receive an access command which is a write command. When the write command is received, a bank address BADD and a column address YADD are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC. Similar to the read operation described above, the access count Xcount stored in the counter memory cells 126 of the row associated with the row address XADD are read to the refresh address control circuit 116, and an updated value of the access count Xcount' is written back to the counter memory cells 126 of the row XADD.

The device 100 may also receive commands causing it to carry out an auto-refresh operation. The refresh signal AREF may be a pulse signal which is activated when the command decoder 106 receives a signal which indicates an auto-refresh command. In some embodiments, the auto-refresh command may be externally issued to the memory device 100. In some embodiments, the auto-refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to the refresh address control circuit 116. The refresh address control circuit 116 supplies a refresh row address RXADD to the row decoder 108, which may refresh a wordline WL indicated by the refresh row address RXADD. The refresh address control circuit 116 may control a timing of the refresh operation, and may generate and provide the refresh address RXADD. The refresh address control circuit 116 may be controlled to change details of the refreshing address RXADD (e.g., how the refresh address is calculated, the timing of the refresh addresses), or may operate based on internal logic.

The refresh address control circuit 116 may selectively output a targeted refresh address (e.g., a victim address) or an automatic refresh address (auto-refresh address) as the refreshing address RXADD. The automatic refresh addresses may be a sequence of addresses which are provided based on activations of the auto-refresh signal AREF. The refresh address control circuit 116 may cycle through the sequence of auto-refresh addresses at a rate determined by AREF. In some embodiments, the sequence of auto-refresh addresses may include all the addresses in the memory bank 118. In some embodiments, the auto-refresh signal AREF may be issued with a frequency such that most or all of the addresses in the memory bank 118 are refreshed within a certain period, which may be based on an expected rate at which information in the memory cells MC decays.

The refresh address control circuit 116 may also determine targeted refresh addresses which are addresses that require refreshing (e.g., victim addresses corresponding to victim rows) based on the access pattern of nearby addresses (e.g., aggressor addresses associated with aggressor rows) in the memory array 118. The refresh address control circuit 116 may monitor accesses to the different wordlines WL of the memory bank. When the row decoder 108 sends an access command to a particular row, the counter memory cells 126 along that row may have their information read to the refresh address control circuit 116 as the access count Xcount. The refresh address control circuit 116 may determine an access count of the row based on the values stored in the counter memory cells 126 of the accessed row.

The refresh address control circuit 116 may determine if the accessed row is an aggressor row based on the access count from the counter memory cells 126. If the current row is not an aggressor row, the value of the access count may be changed and then the refresh address control circuit may write the new value of the access count back to the counter memory cells 126 of the accessed row. If the refresh address control circuit 116 determines that the accessed row is an aggressor, then the refresh address control circuit 116 may use the row address XADD of the accessed row to determine one or more victim row addresses and provide them as a refresh address RXADD as part of a targeted refresh operation. When the accessed row is determined to be an aggressor, the access count Xcount associated with that row may be reset (e.g., to a minimum value, such as 0). In some embodiments, the refresh address control circuit 116 may queue up identified aggressor addresses (e.g., in a register) for later use in targeted refresh operations.

The refresh address RXADD may be provided with a timing based on a timing of the refresh signal AREF. The refresh address control circuit 116 may have time slots corresponding to the timing or AREF, and may provide one or more refresh addresses RXADD during each time slot. In some embodiments, the targeted refresh address may be issued in (e.g., "steal") a time slot which would otherwise have been assigned to an auto-refresh address. In some embodiments, certain time slots may be reserved for targeted refresh addresses, and the refresh address control circuit 116 may determine whether to provide a targeted refresh address, not provide an address during that time slot, or provide an auto-refresh address instead during the time slot.

The targeted refresh address may be based on access characteristics over time of the row addresses XADD received from the address decoder 104. For example, the access characteristics may be determined based on the value of the access count Xcount stored in the count memory cells 126. The refresh address control circuit 116 may use different methods to calculate a targeted refresh address based on a row address XADD identified as an aggressor address based on the access count. For example, the refresh address control circuit 116 may determine if a given row is an aggressor address, and then calculate and provide addresses corresponding to victim addresses of the aggressor address as the targeted refresh address. In some embodiments, more than one victim address may correspond to a given aggressor address. In this case the refresh address control circuit may queue up multiple targeted refresh addresses, and provide them sequentially when it determines that a targeted refresh address should be provided. The refresh address control circuit 116 may provide the targeted refresh address right away, or may queue up the targeted refresh address to be provided at a later time (e.g., in the next time slot available for a targeted refresh).

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
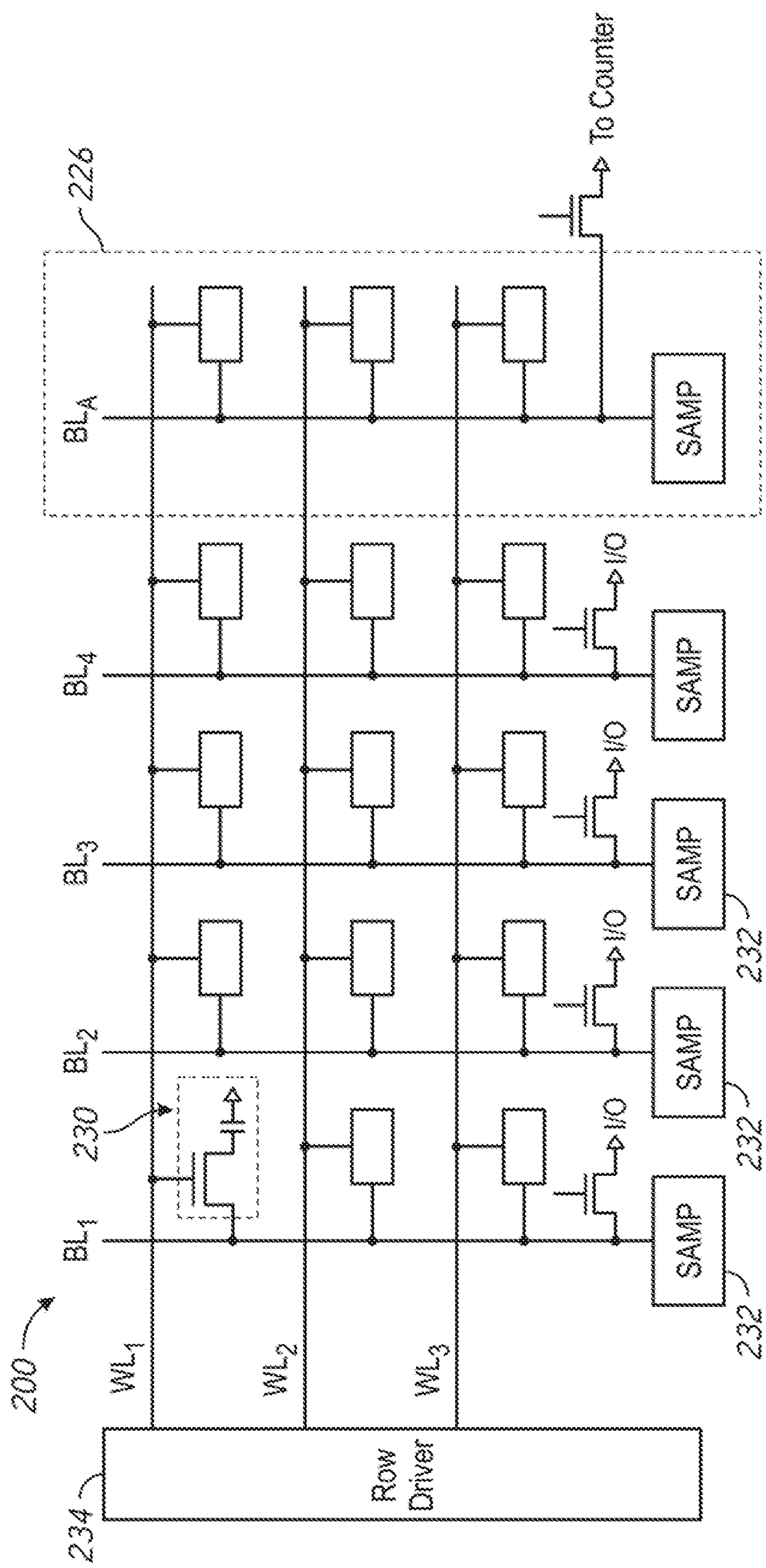
FIG. 2 is a block diagram of a memory cell array according to an embodiment of the present disclosure.

FIG. 2 is a block diagram of a memory cell array according to an embodiment of the present disclosure. The memory cell array 200 may represent an exemplary portion of a memory array, such as the memory array 118 of FIG. 1. The memory cell array 200 includes a plurality of word lines WL (rows) and bit lines BL (columns). A row driver 234 is coupled to the rows. A plurality of memory cells MC, such as example memory cell 230, are located at the intersection of the rows and columns. Certain of the memory cells along each of the wordlines WL may be counter memory cells 126. Each of the bitlines BL may be coupled to a respective sense amplifier 232.

Each of the memory cells MC may store information. In some embodiments, the information may be stored as a binary code, and each memory cell MC may store a bit, which may be either at a logical high or a logical low level. Example memory cell 230 shows a particular implementation which may be used to store a bit of information in some embodiments. Other types of memory cells may be used in other examples. In the example memory cell 230, a capacitive element stores the bit of information as a charge. A first charge level may represent a logical high level, while a second charge level may represent a logical low level. One node of the capacitive element is coupled to a reference voltage (e.g., VSS). The other node of the capacitive element is coupled to a switch. In the example memory cell 230, the switch is implemented using a transistor. A sense node of the switch (e.g., the gate of the transistor) is coupled to the wordline. The wordline WL may be accessed by the row driver 234 setting a voltage along the wordline such that the switches in the memory cells MC are closed, coupling the capacitive elements (or other bit storage element to the associated bitlines BL.

The sense amplifiers 232 may read or write a value of a bit of information along the bitline BL to memory cell MC at the accessed wordline WL. The sense amplifiers may convert a signal along the bit line to a signal which is 'readable' by other elements of the memory device (e.g., by amplifying a voltage). The bit lines may be coupled to an input/output circuit (e.g., input/output circuit 122 of FIG. 1) via a respective column select switch, which may be a column select transistor.

In an example read operation, when a wordline WL is accessed, the memory cells MC may provide their charge onto the coupled bitlines BL which may cause a change in a voltage and/or current along the bitline BL. The sense amplifier 232 may determine a logical level of the accessed memory cell MC based on the resulting voltage and/or current along the bitline BL, and may provide a signal corresponding to the logical level through the column select transistor to the input/output circuit.

In an example write operation, the sense amplifiers 232 may receive a signal indicating a logical level to be written to the accessed memory cells from the input/output circuit. The sense amplifier 232 may provide a voltage and/or current along the coupled bitline BL (e.g., along the bitlines with active column select transistors) at a level corresponding to the logical level to be written. The voltage and/or current along the bitline BL may charge the capacitive element at the intersection of the bitline with an accessed wordline to a charge level associated with the written logical level. In this manner, by specifying the row which is accessed, and which bitlines to record data from (and/or write data to), specific memory cells MC may be accessed during one or more operations of the memory device.

During an example refresh operation (either targeted or auto-refresh), the wordline WL to be refreshed may be read, and then logical value read from each of the memory cells along that may be written back to the same memory cells. In this manner the level of charge in the refreshed memory cells MC may be restored to the full value associated with the logical level stored in that memory cell.

Certain memory cells along each of the wordlines may be counters memory cells 226. The counter memory cells 226 may generally be similar to the other memory cells of the memory array 200. In some embodiments, the counter memory cells 226 may be physically the same as the other memory cells MC. However, rather than being coupled to the input/output circuit of the memory, the counter memory cells 226 may be coupled to the refresh address control circuit (e.g., refresh address control circuit 116 of FIG. 1). The refresh address control circuit may read and/or write a value of an access count, which may be stored as a binary number in the counter memory cells 226 of a given wordline. In some embodiments, the refresh address control circuit may be in an area local to the counter memory cell 226, and so the communication of the refresh address control circuit and the counter memory cells 226 may be very rapid.

In some embodiments, the counter memory cells 226 may be organized alone particular bitlines of the memory array 200. Thus, there may be counter bitlines (and associated counter sense amplifiers 232) which are coupled to the counter memory cells 226. The counter memory cells 226 may be arranged at the intersection of the counter bitlines and the wordlines. The counter bitlines may include counter select transistors (similar to the column select transistors), which selectively allow data from the counter bitlines to be read to the counter of the refresh address control circuit. In some embodiments, the time duration over which the counter select transistors are active may be different (e.g., the counter select transistors may be active longer) than the time the column select transistor(s) are active in a given access operation. The counter bitlines and counter sense amplifiers may be coupled through a data bus to a counter of a refresh address control circuit. In some embodiments, the counter memory cells 226 may be positioned along an end of the memory array 200. This may decrease a length of the counter data bus. For example, if there are some number n of counter memory cells 226 along each wordline, the counter memory cells 226 may be the first n memory cells of the wordline, or the last n memory cells of the wordline.

For clarity of illustration, only a few wordlines WL and bitlines BL (and their corresponding memory cells MC) are shown in FIG. 2. More wordlines WL and bitlines BL may be provided in a memory array of the present disclosure. Similarly, FIG. 2 only shows a single counter bitline of counter memory cells 226. However, each wordline WL may have a number of counter memory cells 226 based on an expected maximum value of access count that may need to be stored in the counter memory cells 226. In some embodiments, there may be between 8 and 16 counter memory cells 226 along each wordline. More or fewer counter memory cells 226 may be used in other examples.

Figure 3:
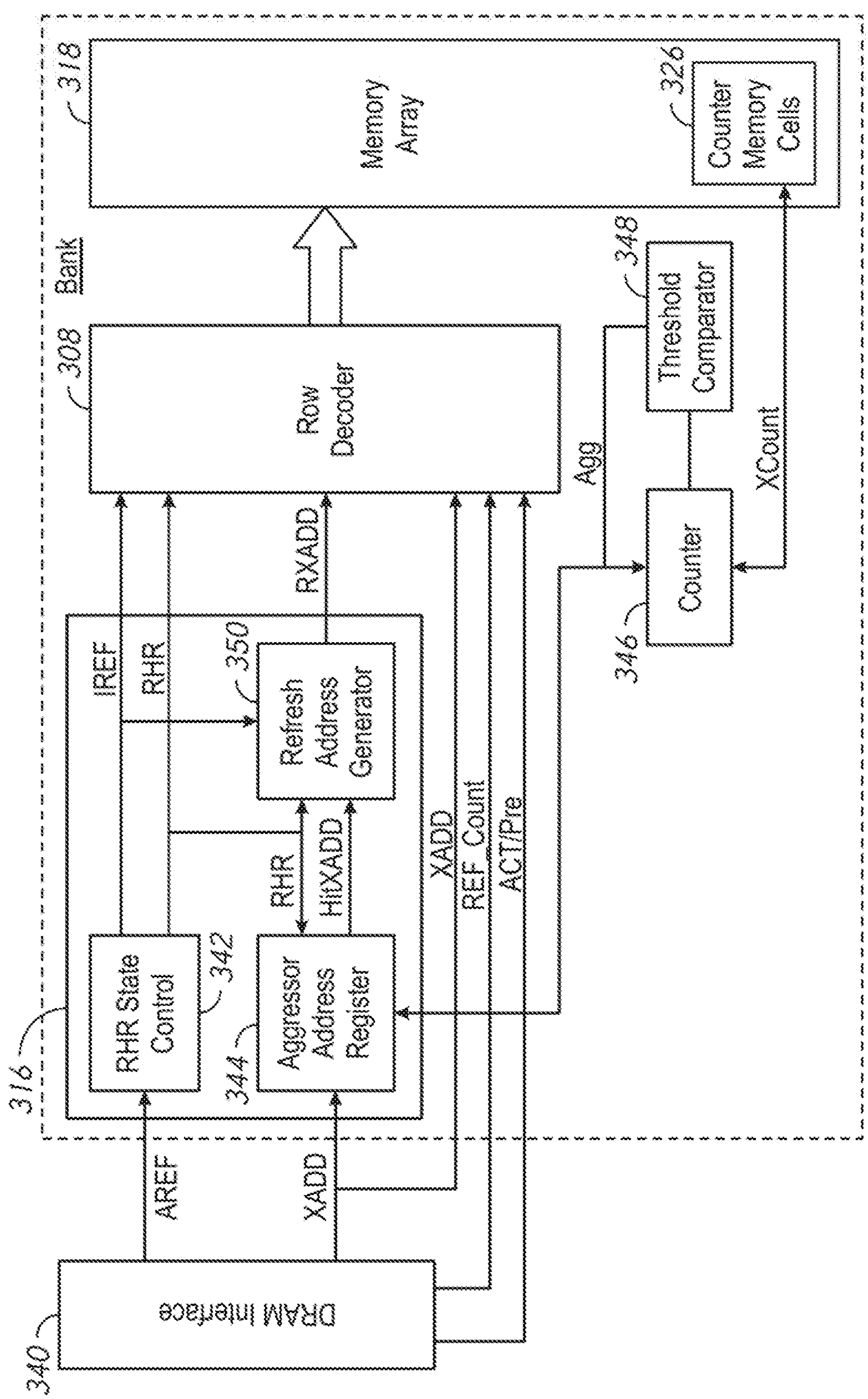
FIG. 3 is a block diagram of a refresh address control circuit according to an embodiment of the present disclosure.

FIG. 3 is a block diagram of a refresh address control circuit according to an embodiment of the present disclosure. In some embodiments, the refresh address control circuit 316 may be used to implement the refresh address control circuit 116 of FIG. 1. Certain internal components and signals of the refresh address control circuit 316 are shown to illustrate the operation of the refresh address control circuit 316. The dotted line around the refresh address control circuit 316, the row decoder 308, and the memory array 318 is shown to represent that in certain embodiments, each of the components within the dotted line may correspond to a particular bank of memory, and that these components may be repeated for each of the banks of memory. In some embodiments, the components shown within the dotted line may be associated with each of the memory banks. Thus, there may be multiple refresh address control circuits 316 and row decoders 308. For the sake of brevity, components for only a single bank will be described.

A DRAM interface 340 may provide one or more signals to an address refresh control circuit 316 and row decoder 30 which in turn (along with a column decoder, not shown) may perform access operation on a memory array 318. The refresh address control circuit 316 may include an RHR state control 342, an aggressor address register 344, a refresh address generator 350, a counter 346, and a threshold comparator 348. The counter 346 may be coupled to counter memory cells 326 in the memory array 318.

When a row of the memory array 318 is accessed, the values of the counter memory cells 326 along that row are read to the counter 346. The counter 346 may determine a value of the access count for that row based on the values read from the counter memory cells 326. The counter 346 may be a count control circuit, which may manage a value of the count stored in the counter memory cells 326 (e.g., by reading the raw data in the counter memory cells 326 as a numerical value, writing new numerical values to the counter memory cells 326 etc.). The counter 346 may provide the count value to a threshold comparator 348, which may determine if the value of the count exceeds a threshold (e.g., if the value is greater than the threshold). If the value does not exceed the threshold (e.g., if the value is less than or equal to the threshold), then the counter may increment a value of the count and write the incremented count back to the counter memory cells 326. If the value does exceed the threshold, then the current address XADD may be determined to be an aggressor address. If the current address XADD is an aggressor address, a signal Agg may be provided to the aggressor address register 344, which may record (e.g., latch) the current value of the row address XADD. If the value of the count exceeds the threshold, then the counter 346 may reset a value of the count by writing an initial value of the count (e.g., 0) back to the counter memory cells 326.

The RHR state controller 342 may provide the signal RHR to indicate that a targeted refresh operation, such as a row hammer refresh (e.g., a refresh of the victim rows corresponding to an identified aggressor row) should occur. The RHR state controller 342 may also provide an internal refresh signal IREF, to indicate that an auto-refresh operation should occur. Responsive to an activation of RHR, the aggressor address register 344 may provide an aggressor address HitXADD, and the refresh address generator 350 may provide a refresh address RXADD, which may be one or more victim addresses associated with HitXADD. Responsive to IREF, the refresh address generator 350 may provide an auto-refresh address as the refresh address RXADD. The row decoder 308 may perform a refresh operation responsive to the refresh address RXADD and the row hammer refresh signal RHR. The row decoder 308 may perform an auto-refresh operation based on the refresh address RXADD and the internal refresh signal IREF.

The DRAM interface 340 may represent one or more components which provides signals to components of the bank. In some embodiments, the DRAM interface 340 may represent a memory controller coupled to the semiconductor memory device (e.g., device 100 of FIG. 1). In some embodiments, the DRAM interface 340 may represent components such as the command address input circuit 102, the address decoder 104, and/or the command decoder 106 of FIG. 1. The DRAM interface 340 may provide a row address XADD, the auto-refresh signal AREF, an activation signal ACT, and a precharge signal Pre. The auto-refresh signal AREF may be a periodic signal which may indicate when an auto-refresh operation is to occur. The activation signal ACT may be provided to activate a given bank of the memory. The precharge signal Pre may be provided to precharge the given bank of the memory. The row address XADD may be a signal which specifies one or more particular wordlines of the memory array 318, and may be a signal including multiple bits (which may be transmitted in series or in parallel).

The counter 346 and threshold comparator 348 may work together to determine if the access count for the row associated with the current row address XADD exceeds a threshold. When a given wordline is accessed, the value stored in each of the counter memory cells 326 along that wordline are read to the counter 346, which interprets the values of the counter memory cells 326 as an access count XCount. The counter 346 may interpret the memory cells 326 by determining a value of the access count XCount based on the bits stored in the counter memory cells 326. The threshold comparator 348 may compare the value of the access count XCount to a threshold value. In some embodiments, the value of the threshold may be a programmable value. The threshold comparator 348 may provide the signal Agg if the value of the count exceeds the value of the threshold. If the value of the count does not exceed the threshold, the counter 346 increments the value of the count, and writes the incremented value back to the counter memory cells 326. If the value of the count does exceed the threshold, the counter 346 may reset the value of the access count back to a minimum value and write the reset value back to the counter memory cells 326.

In some embodiments, the counter 346 may also increment the value of the access count if the accessed row remains activated for a certain period of time. The counter 346 may be coupled to a timer (e.g., an oscillator) which may periodically activate a timing signal. After incrementing the value of the access count when the row is accessed, the counter 346 may increment the access count again each time the timing signal activates. In some embodiments, each time the timing signal activates, the value of the access count may be compared to the threshold again. In an example timing, the counter 346 may increment an accessed row every 100-200 ns that it remains accessed. Other timings may be used in other examples. In the embodiment with a timer, additional logic may be used by the refresh address control circuit 316 to monitor activations of the memory array 318, to prevent information from being lost (e.g., the refresh address control circuit 316 may ensure that there is enough time to increment the value of the access count before updating the value).

In some embodiments, the counter 346 may directly determine if the value of the access count exceeds a threshold, and the threshold comparator 348 may be omitted. For example, the counter may have a maximum value, and when it increments after reaching the maximum value, the counter 346 may "roll over" back to a minimum value. The counter 346 may provide the signal Agg responsive to rolling over. In addition, since the value of the counter resets to the minimum value, the rolled over value of the counter may be written back to the counter memory cells 326 to reset them after the signal Agg flags the accessed row as an aggressor address.

In some embodiments, the counter 346 and the threshold comparator 348 may be physically close to the memory array 318, such that the counter bus XCount is relatively short compared to other buses into and out of the memory array 318. When either the comparator 348 or the counter 346 determines that value of XCount exceeds the threshold, the signal Agg may be sent to the aggressor address register 344 (and/or other components of the address refresh control circuit 316). In some embodiments, the counter 346 and the comparator 348 may be closer to the memory array 318 than the other components of the refresh address control circuit 316 (e.g., the RHR state control 342, the aggressor address register 344, and/or the refresh address generator 350). In some embodiments, the counter 346 and the threshold comparator 348 may be circuits which are local to the memory array 318, while the other components of the refresh address control circuit 316 may be bank level circuits. In some embodiments, only the signal Agg needs to run to the bank level circuits, which may reduce an area and power required for the XCount bus.

The aggressor address register 344 may store one or more row addresses which have been identified as aggressor addresses based on their access counts. Responsive to the command signal Agg from the threshold comparator 348, the aggressor address register 344 may store the current row address XADD which is being accessed. The aggressor address register 344 may provide the stored address as a match address HitXADD to the refresh address generator 350, which may calculate one or more victim addresses associated with the match address HitXADD. In some embodiments, the aggressor address register 344 may be a latch circuit which stores a single address. In some embodiments, the aggressor address register 344 may be a buffer which stores multiple addresses, and provides the first stored address as the match address HitXADD. The aggressor address register 344 may switch to a next address in the register after the victim row(s) associated with the first address have been refreshed.

The RHR state controller 342 may receive the auto-refresh signal AREF and provide the row hammer refresh signal RHR. The auto-refresh signal AREF may be periodically generated and may be used to control the timing of refresh operations. The memory device may carry out a sequence of auto-refresh operations in order to periodically refresh the rows of the memory device. The RHR signal may be generated in order to indicate that the device should refresh a particular targeted row (e.g., a victim row) instead of an address from the sequence of auto-refresh addresses. The RHR state controller 342 may use internal logic to provide the RHR signal. In some embodiments, the RHR state controller 342 may provide the RHR signal based on certain number of activations of AREF (e.g., every $4^{th}$ activation of AREF). The RHR state controller 342 may also provide an internal refresh signal IREF, which may indicate that an auto-refresh operation should take place. In some embodiments, the signals RHR and IREF may be generated such that they are not active at the same time (e.g., are not both at a high logic level at the same time).

The refresh address generator 350 may receive the row hammer refresh signal RHR and the match address HitXADD. The match address HitXADD may represent an aggressor row. The refresh address generator 350 may determine the locations of one or more victim rows based on the match address HitXADD and provide them as the refresh address RXADD. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples.

The refresh address generator 350 may determine the value of the refresh address RXADD based on the row hammer refresh signal RHR and the internal auto-refresh signal IREF. In some embodiments, when the signal IREF is active, the refresh address generator 350 may provide one of a sequence of auto refresh addresses. When the signal RHR is active, the refresh address generator 350 may provide a targeted refresh address, such as a victim address, as the refresh address RXADD.

The row decoder 308 may perform one or more operations on the memory array 318 based on the received signals and addresses. For example, responsive to the activation signal ACT and the row address XADD (and IREF and RHR being at a low logic level), the row decoder 308 may direct one or more access operations (for example, a read operation) on the specified row address XADD. Responsive to the RHR signal being active, the row decoder 308 may refresh the refresh address RXADD. In some embodiments, the counter 346 may increment the access count stored in the counter memory cells 326 responsive to a refresh operation of a given row. In some embodiments, the counter 346 may not increment the access count responsive to a refresh operation.

Figure 4:
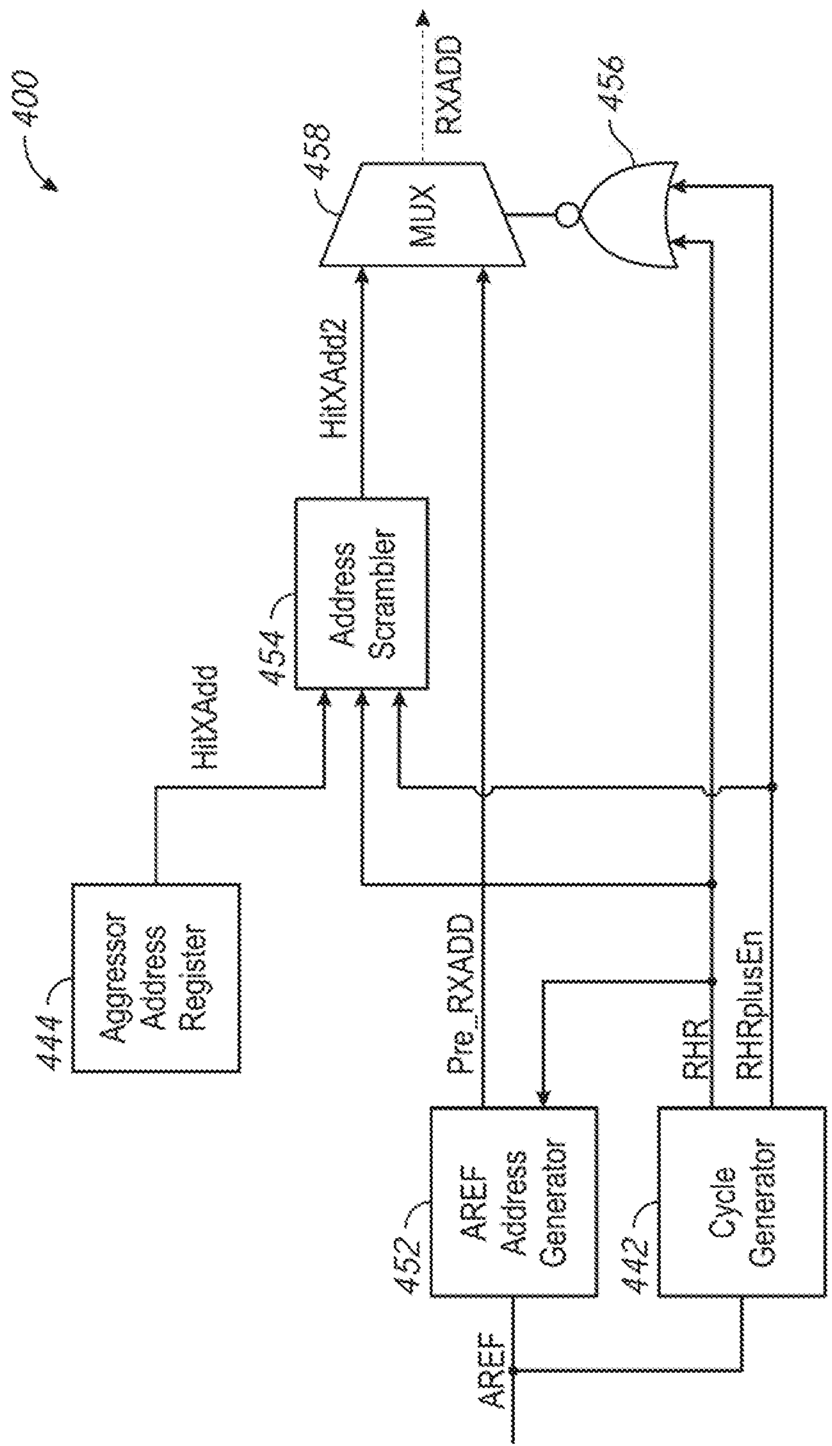
FIG. 4 is a block diagram of a refresh address generator according to an embodiment of the present disclosure.

FIG. 4 is a block diagram of a refresh address generator according to an embodiment of the present disclosure. In some embodiments, the refresh address generator 400 may be used to implement the refresh address generator 350 of FIG. 3. The refresh address generator 400 may include the RHR state controller 342 of FIG. 3 as cycle generator 442. The refresh address generator 400 receives the match address HitXADD (which, in some embodiments, may be an identified aggressor address) from aggressor address register 444 (e.g., aggressor address register 344 of FIG. 3) and also receives the auto-refresh signal AREF. The refresh address generator 400 provides either an auto-refresh address Pre_RXADD or a victim address HitXADD2 based on match address HitXADD as the refresh address RXADD. The refresh address generator 400 may include an auto-refresh address generator 452 (AREF address generator), a cycle generator 442, an address scrambler 454, a multiplexer 458, and a NOR gate circuit 456.

The refresh cycle generator 442 determines if an automatic refresh operation or a targeted refresh operation will occur. In some embodiments, where the refresh address generator 400 is capable of generating multiple types of victim addresses (e.g., of victim rows with different physical relationships to the identified aggressor row) the refresh cycle generator 442 may also determine which type targeted refresh operation will occur. In the particular embodiment of FIG. 4, the refresh address generator 400 may provide a first set of victim addresses and a second set of victim addresses for a given aggressor address (e.g., HitXADD). The first set of victim addresses may be physically adjacent to the aggressor address (e.g., HitXADD+1 and HitXADD−1). The second set of victim addresses may be physically adjacent to the physically adjacent rows (e.g., HitXADD+2 and HitXADD−2).

The refresh cycle generator 442 receives the refresh signal AREF and selectively provides the first command signal RHR and/or the second command signal RHRplusEn in response. The first command signal RHR may indicate a first row hammer refresh operation (e.g., refresh the rows adjacent to a row corresponding to HitXADD1). The second command signal RHRplusEn may indicate a second row hammer refresh operation (e.g., refresh rows non-adjacent to a row corresponding to HitXADD1). The second row hammer refresh operation may only be indicated when both the first and second command signals are active. The refresh cycle generator 442 may periodically provide one (or both) of the first and second command signals based on a rate of the automatic refresh signal AREF. The rates that the first and second command signals are provided may be different from each other.

The AREF address generator 452 generates an automatic refresh address Pre_RXADD in response to the refresh signal AREF. The automatic refresh address Pre_RXADD may be part of a sequence at addresses to be refreshed as part of an automatic refresh operation. The AREF address generator 452 may update the current automatic refresh address Pre_RXADD to a next address in the sequence in response to the refresh signal AREF. The AREF address generator 452 is also provided the first command signal RHR from cycle generator 442. When the first command signal is active, the AREF address generator 452 may be controlled to stop updating the automatic refresh address Pre_RXADD even if the automatic refresh signal AREF is active. As described herein, since the command signals indicate that a row hammer refresh operation is to be conducted instead of an automatic refresh operation, this allows the automatic refresh operation to be suspended while the row hammer refresh is carried out, and resumed when the command signals are not active.

The address scrambler 454 calculates one or more addresses to be refreshed based on the match address HitXAdd and which row hammer refresh operation is indicated by the refresh cycle generator 442. The address scrambler 1296 may be provided the match address HitXADD1, the first command signal Rhr, and the second command signal RHRplusEn as inputs. The address scrambler 1296 may provide a hammer refresh address HitXADD2 in response to these inputs. The hammer refresh address HitXADD2 may be an address for a memory location (e.g., a wordline) that may be affected by repeated activation of the memory location corresponding to the match address HitXADD. In other words, the match address HitXADD may be an 'aggressor' address, and the hammer refresh address HitXADD2 may be a 'victim' address. Different calculations may be used for generating different victim addresses as the hammer refresh address HitXADD2.

The address scrambler 454 may calculate the hammer refresh address HitXADD2 based on the match address HitXADD. The address scrambler may employ different calculations based on the state of the first command signal RHR and the second command signal RHRplusEn. In one example, a first calculation may be used when RHR alone is active, and a second calculation may be used when both RHR and RHRplusEn are active. The calculations may provide hammer refresh addresses HitXADD2 corresponding to wordlines which have a known physical relationship (e.g., a spatial relationship) with a wordline corresponding to the match address HitXADD. The calculations may result in a single hammer refresh address HitXADD2 in some embodiments of the disclosure. The calculations may result in a sequence of hammer refresh address HitXADD2 in other embodiments of the disclosure. The calculations triggered by the first command signal RHR may provide hammer refresh addresses HitXADD2 corresponding to first refresh wordlines of a memory with a first physical relationship to an aggressor wordline corresponding to the match address HitXADD and the second command signal RHRplusEn ma provide hammer refresh addresses HitXADD2 corresponding to second refresh wordlines having a second physical relationship to the match address HitXADD.

In one embodiment, the first calculation triggered by first command signal RHR causes the address scrambler 454 to output a pair of addresses which are adjacent to the match address HitXADD1 (e.g., HitXADD2==HitXADD1+/−1). The second calculation may be triggered by both first command signal RHR and second command signal RHRplusEn being active, and may cause the address scrambler 454 to output a pair of addresses which are adjacent to the adjacent addresses of the hammer address HitXADD1 (e.g., HitXADD2=HitXADD1+/−2). Other calculations are possible in other example embodiments. For example, the first calculation may be based on a physical relationship with the match address HitXADD1, while the second calculation may be based on a physical relationship with the address(es) provided by the first calculation.

The multiplexer 458 which accepts the automatic refresh address Pre_RXADD provided by the AREF address generator 452 and the hammer refresh address HitXADD2 provided by the address scrambler 454 and outputs one of them as the refreshing address RXADD. The multiplexer 458 may select between the two refresh addresses based on the first and second command signals RHR and RHRplusEn. For example, a NOR gate circuit 456 is provided the first and second command signals RHR and RHRplusEn and an output is provided to the multiplexer 458 to control selection of providing the Pre_RXADD or HitXADD2 addresses as the refreshing address RXADD. The NOR gate circuit 456 outputs a low logic level if either or both of the first and second command signals Rhr, RHRplusEn is active (e.g., at a high level). The multiplexer 458 outputs the hammer refresh address HitXADD2 in response to that low logic level. Thus, the multiplexer 458 outputs the hammer refresh address HitXADD2 if either of the command signals indicating a row refresh is active, and outputs the automatic refresh address Pre_RXADD otherwise.

In this manner, the refresh address generator 400 selectively outputs a refreshing row address RXADD, which may be used by the row decoder (e.g., row decoder 108 of FIG. 1) to refresh a given memory location corresponding to that address. The cycle generator 442 selectively activates the first command signal RHR and the second command signal RHRplusEn to cause the address scrambler 454 to calculate a hammer refresh address HitXADD2 based on the match address HitXADD identified by the aggressor address register 444, and causes refresh address generator 400 to output it as the refreshing row address RXADD. The cycle generator 442 controls when a hammer refresh address HitXADD2 is calculated and provided as the refresh address RXADD, and also controls which calculations should be used to generate the victim address HitXADD2.

The refresh address generator 400 of FIG. 4 may show a particular embodiment of a refresh address generator which provides multiple different types of victim addresses based on an identified aggressor address. For example, the refresh address generator 400 provides refresh addresses which are adjacent to the aggressor address (e.g., +/−1) and also addresses which are adjacent to the adjacent addresses (e.g., +/−2). In other embodiments, the refresh address generator may provide only a single type of victim address (e.g., only the adjacent addresses). Such an embodiment may generally be similar to the embodiment shown in FIG. 4, but the signal RHRplusEn and the NOR gate 456 may be eliminated.

Figure 5:
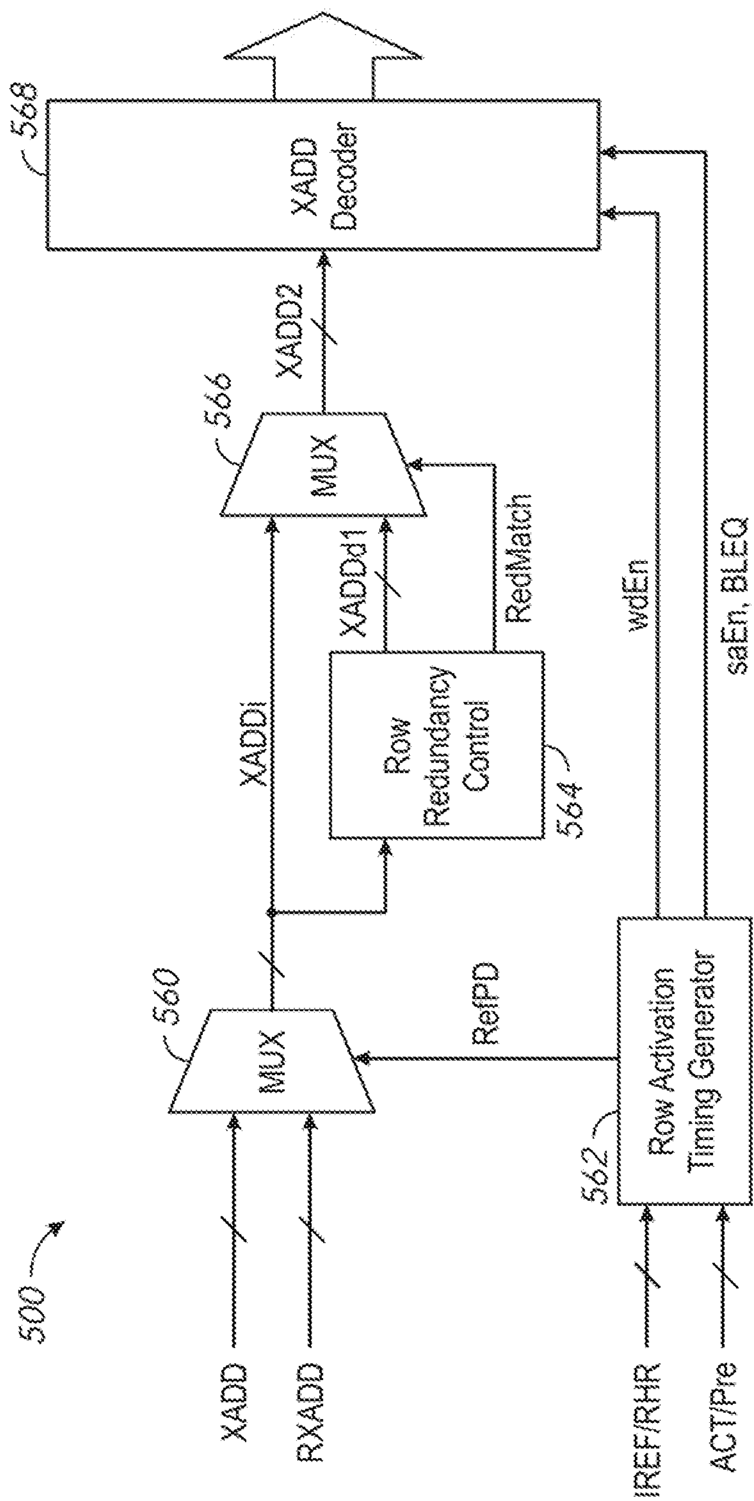
FIG. 5 is a block diagram of a row decoder according to an embodiment of the present disclosure.

FIG. 5 is a block diagram of a row decoder according to an embodiment of the present disclosure. The row decoder 500 may implement the row decoder 108 of FIG. 1 and/or the row decoder 308 of FIG. 3 in some embodiments of the disclosure. The row decoder 500 may determine whether to activate a word line of the memory bank (e.g., a bank of memory array 118 of FIG. 1, 200 of FIG. 2, and/or 308 of FIG. 3) corresponding to the row address XADD or the refresh address RXADD.

As shown in FIG. 5, the row decoder 500 is provided with a row activation timing generator 562, which receives the internal refresh signal IREF and the row hammer refresh signal RHR, the active signal ACT, and the pre-charge signal Pre and provides a state signal RefPD, a word-line actuation signal wdEn, a sense-amplifier actuation signal saEn, and a bit-line equalize signal BLEQ. In some embodiments, the signals IREF and RHR may be the auto-refresh signal AREF. The state signal RefPD is supplied to a multiplexer 560, which selects one of the row address XADD and the refresh address RXADD. An address XADDi selected by the multiplexer 560 is supplied to a row redundancy control circuit 564. If the word line indicated by the address XADDi is replaced a redundant word line, a hit signal RedMatch is activated, and a row address XADDd1, which is a replacement destination, is generated. The addresses XADDi and XADDd1 are supplied to a multiplexer 566; wherein, if the hit signal RedMatch is not activated, the address XADDi is selected; and, if the hit signal RedMatch is activated, the address XADDd1 is selected. The selected address XADD2 is supplied to an X address decoder 568. The X address decoder 568 controls the operation of the word line indicated by the address XADD2, the sense amplifier corresponding thereto, an equalize circuit, etc. based on the word-line actuation signal wdEn, the sense-amplifier actuation signal saEn, and the bit-line equalize signal BLEQ.

Figure 6:
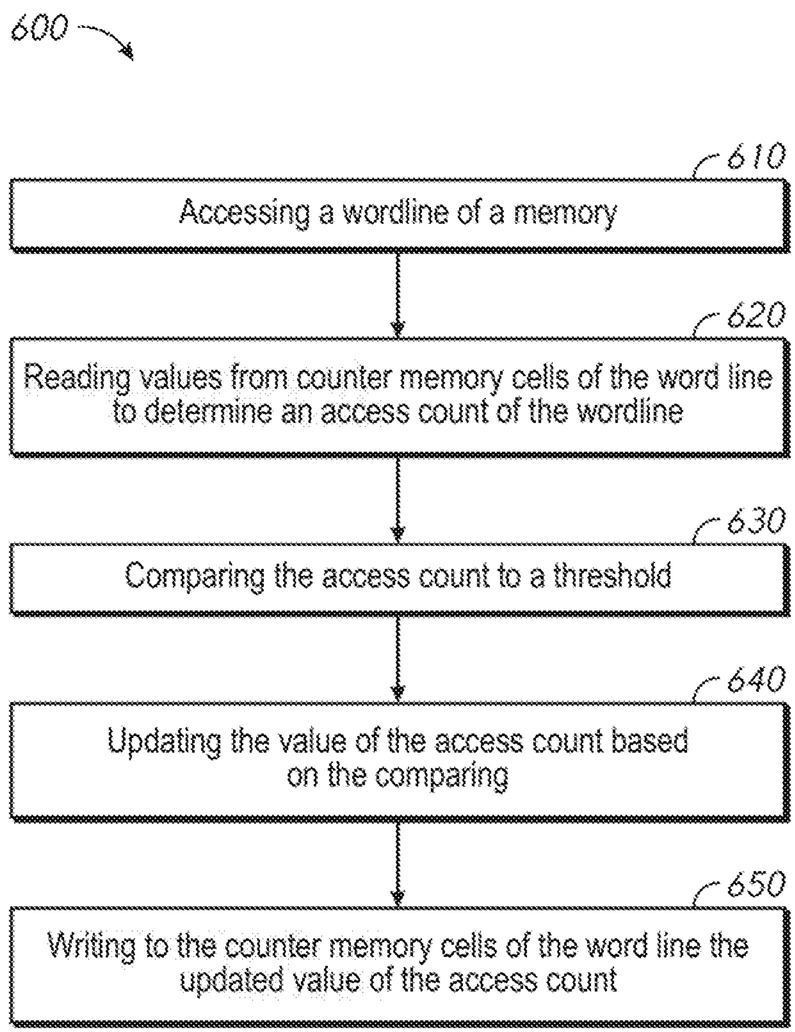
FIG. 6 is a flow chart depicting a method of managing row access counts according to an embodiment of the present disclosure.

FIG. 6 is a flow chart depicting a method of managing row access counts according to an embodiment of the present disclosure. The method 600 includes block 610, which describes accessing a wordline of a memory. Block 610 may generally be followed by block 620, which describes reading values from counter memory cells of the wordline to determine an access count of the wordline. Block 620 may generally be followed by block 630, which describes comparing the access count to a threshold. Block 630 may generally be followed by block 640, which describes updating the value of the access count based on the comparing. Block 640 may generally be followed by block 650, which describes writing to the counter memory cells of the accessed wordline the updated value of the access count. Although the method 600 is described with respect to certain steps (e.g., as described in blocks 610-650) it will be appreciated that more or less steps may be used in other embodiments, or that steps may be repeated and/or performed in different orders.

Block 610 describes accessing a wordline of a memory. The memory may include a memory array, with information stored in a plurality of memory cells. The memory cells may be arranged at the intersection of wordlines (rows) and bitlines (columns). In order to perform an access operation (such as a read and/or write operation) to particular memory cells, a wordline of the memory may be accessed. During the access operation a voltage may be applied to the wordline, which may allow the information in the memory cells to be read out along the bitlines.

Block 620 describes reading values from counter memory cells of the wordline to determine an access count of the wordline. Each wordline may include a plurality of memory cells. A portion of the memory cells along each wordline may be counter memory cells. The information stored in the counter memory cells of a given wordline may represent an access count of that wordline. The counter memory cells may be arranged at the intersection of the wordline with a number of counter bitlines. When the wordline is accessed, the counter memory cells may be read out along the counter bitlines to a counter circuit (e.g., counter 346 of FIG. 3), which may determine a value of the access count based on the values read from the counter memory cells.

Block 630 describes comparing the access count to a threshold. The value of the access count read from the memory cells may be compared to a threshold value to determine if the currently accessed wordline is an aggressor wordline. The threshold may be a set property of the memory, or may be programmable value. In some embodiments, there may be a threshold comparator (e.g., threshold comparator 348 of FIG. 3) which compares the value of the access count to the threshold. In some embodiments, the counter may manage the comparing itself (e.g., by sending a signal when the counter rolls from a maximum value back to a minimum value). A command signal may be generated responsive to the value of the access count being greater than the value of the threshold. An address associated with the accessed wordline may be latched responsive to the command signal. The latched address may be used to determine one or more victim rows for a targeted refresh operation.

Block 640 describes updating the value of the access count based on the comparing. If the value of the access count is at or below the threshold, the value of the access count may be incremented by the counter. If the value of the access count is above the threshold, the value of the access count may be reset to a minimum value (e.g., 0). In some embodiments, the counter may reset the value of the access count based on 'rolling over' by incrementing from a maximum value back to a minimum value of the counter. In some embodiments, the value of the access count may be incremented again if the wordline remains accessed for more than a certain period of time. For example, the counter may be coupled to an oscillator, which may produce a periodically activate a timing signal. Each time the timing signal activates the counter may increment the value of the access count (in addition to the initial increment when the wordline was first accessed). In some embodiments, the value of the access count may be compared to the threshold again each time it is incremented due to the timing signal.

Block 650 describes writing to the counter memory cells of the accessed wordline the updated value of the access count. Once the value of the access count has been updated (e.g., incremented or reset to a minimum value), the updated value is written back to the counter memory cells of the accessed wordline. The updated value may be written hack while the wordline is still accessed from the initial access operation (e.g., as described in block 610).

In some embodiments of the disclosure, a targeted refresh on one or more victim wordlines associated with the accessed wordline may be performed based on comparing the access count to the threshold. For example, if the access count is greater than the threshold, then the accessed wordline may be identified as an aggressor wordline. An address associated with the accessed wordline may be latched (e.g., in aggressor address register 344 of FIG. 3 or 444 of FIG. 4) responsive to the access count of the accessed wordline being greater than the threshold. A refresh address control circuit (e.g., refresh address control circuit 116 of FIG. 1 or 316 of FIG. 3) may indicate that a targeted refresh operation should be performed, with timing based off an auto-refresh signal of the memory. When performing a targeted refresh operation, the refresh address control circuit may calculate addresses associated with one or more victim wordlines associated with an aggressor address retrieved from the latch. In some embodiments, these victim rows may be adjacent to the accessed wordline. The victim wordlines may then be refreshed. In this manner, a memory device may count accesses to the wordlines of the memory device, may identify certain wordlines as aggressor wordlines based on the access counts, and may perform targeted refreshes of victim wordlines associated with the identified aggressor wordlines.

It is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:

a memory array comprising a wordline and a plurality of counter memory cells, wherein the counter memory cells are configured to store a number of accesses to the wordline;

a refresh address control circuit configured to determine if the wordline is an aggressor word line based on the number of accesses, and if the wordline is identified as an aggressor wordline, the refresh address control circuit further configured to generate a targeted refresh address for a wordline that is different than the aggressor wordline.

2. The apparatus of claim 1, further comprising a counter circuit configured to receive the number accesses from the counter memory cells and update the number of accesses based on a comparison of the number of accesses to a threshold.

3. The apparatus of claim 2, wherein the counter circuit is configured to increase the number of accesses responsive to the number of accesses being below the threshold and wherein the counter circuit is configured to reset the number of accesses responsive to the number of accesses being above the threshold.

4. The apparatus of claim 2, further comprising an oscillator configured to periodically activate a timing signal, wherein the counter circuit is further configured to update the number of accesses responsive to activations of the timing signal.

5. The apparatus of claim 1, wherein responsive to a read operation, information stored in memory cells along the word line is read out along a first data bus and the number of accesses is read out along a second data bus.

6. The apparatus of claim 1, wherein a victim word line associated with the targeted refresh address is refreshed as part of a targeted refresh operation.

7. An apparatus comprising:

a memory array comprising a plurality of memory cells and a plurality of counter memory cells configured to store a number;

a counter circuit configured to receive the number, update the number, and write the updated number back to the counter memory cells responsive to an access command associated with the plurality of memory cells; and a refresh control circuit configured to determine if a received row address is associated with an aggressor wordline based on the number, and further configured to refresh a victim wordline associated with a row address different than the received row address if the received row address is determined to be associated with the aggressor wordline.

8. The apparatus of claim 7, wherein the plurality of memory cells are positioned along a word line, and wherein the number represents a number of accesses to the word line.

9. The apparatus of claim 7, wherein the refresh control circuit is configured to generate a targeted refresh address based on the received row address if the received row address is associated with an aggressor word line, and wherein at least one victim word line associated with the targeted refresh address is refreshed as part of a targeted refresh operation.

10. An apparatus comprising:

a memory array comprising a plurality of memory cells and a plurality of counter memory cells configured to store a number; and a counter circuit configured to receive the number, update the number, and write the updated number back to the counter memory cells responsive to an access command associated with the plurality of memory cells, wherein the counter circuit is configured to update the number by increasing the number if the number is less than a threshold and wherein the counter circuit is configured to reset the number if the number is greater than a threshold.

11. The apparatus of claim 7, further comprising:

a first data bus configured to couple the plurality of memory cells to an input/output circuit; and a second data bus configured to couple the plurality of counter memory cells to the counter circuit.

12. A method comprising:

receiving a row address associated with a word line of a memory array;

updating a count value stored in counter memory cells of the memory array responsive to receiving the row address;

determining if the word line is an aggressor word line based on the count value; and refreshing another word line of the memory array if the word line is determined to be an aggressor word line.

13. The method of claim 12, further comprising comparing the count value to a threshold to determine if the word line is an aggressor word line.

14. The method of claim 13, further comprising:

updating the count value by increasing the count value responsive to the count value being below the threshold; and updating the count value by resetting the count value responsive to the count value being above the threshold.

15. The method of claim 12, further comprising accessing the word line responsive to receiving the row address and an access command.

16. A method comprising:

receiving a row address associated with a word line of a memory array;

updating a count value stored in counter memory cells of the memory array responsive to receiving the row address;

determining if the word line is an aggressor word line based on the count value;

identifying a victim word line based on the word line if the word line is determined to be an aggressor word line; and refreshing the victim word line.

17. The method of claim 12, further comprising:

reading the count value out along counter bit lines to a counter circuit responsive to receiving the row address;

updating the count value with the counter circuit; and writing the updated count value back to the counter memory cells.

18. The method of claim 12, further comprising:

periodically activating a timing signal; and updating the count value responsive to activations of the timing signal.

* * * * *